United States Patent
Horiguchi et al.

(10) Patent No.: US 6,719,849 B2
(45) Date of Patent: Apr. 13, 2004

(54) SINGLE-SUBSTRATE-PROCESSING APPARATUS FOR SEMICONDUCTOR PROCESS

(75) Inventors: Takahiro Horiguchi, Tsukui-gun (JP); Naofumi Oda, Tsukui-gun (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 09/855,493

(22) Filed: May 16, 2001

(65) Prior Publication Data
US 2001/0052321 A1 Dec. 20, 2001

(30) Foreign Application Priority Data
May 22, 2000 (JP) .......................... 2000-149208

(51) Int. Cl.$^7$ ............................ H01L 21/00; C23C 16/00
(52) U.S. Cl. .................. 118/725; 118/728; 156/345.51; 156/345.52
(58) Field of Search .................. 118/725, 728; 156/345.51

(56) References Cited

U.S. PATENT DOCUMENTS

| | | | | |
|---|---|---|---|---|
| 5,211,795 A | * | 5/1993 | Yoshida et al. ........ 156/345.31 |
| 5,612,144 A | * | 3/1997 | Shinohara et al. ........ 174/5 SG |
| 5,665,167 A | * | 9/1997 | Deguchi et al. ......... 118/723 E |
| 5,948,224 A | * | 9/1999 | Signer et al. ............. 118/723 E |
| 6,106,630 A | * | 8/2000 | Frankel ....................... 118/725 |

FOREIGN PATENT DOCUMENTS

| JP | 60000729 | * | 1/1985 | ............ H01L/21/31 |
|---|---|---|---|---|
| JP | 02043731 | * | 2/1990 | ............ H01L/21/31 |
| JP | 05198498 | * | 8/1993 | ............ H01L/21/27 |
| JP | 07240457 A | * | 9/1995 | ............ H01L/21/68 |
| JP | 2001240973 | * | 9/2001 | ......... C23C/16/505 |

* cited by examiner

Primary Examiner—Gregory Mills
Assistant Examiner—Ram N. Kackar
(74) Attorney, Agent, or Firm—Oblon, Spivak, McClelland, Maier & Neustadt, P.C.

(57) ABSTRACT

A single-substrate-processing apparatus includes an airtight process chamber, in which a worktable is supported by a pedestal. A conduction structure is arranged to conduct static electricity generated on the worktable and a wafer thereon to a grounded portion outside the process chamber. The conduction structure has a conductive film formed on insulating surfaces of the worktable and the pedestal.

19 Claims, 2 Drawing Sheets

SINGLE-SUBSTRATE-PROCESSING APPARATUS FOR SEMICONDUCTOR PROCESS

CROSS-REFERENCE TO RELATED APPLICATIONS

This application is based upon and claims the benefit of priority from the prior Japanese Patent Application No. 2000-149208, filed May 22, 2000, the entire contents of which are incorporated herein by reference.

BACKGROUND OF THE INVENTION

The present invention relates to a single-substrate-processing apparatus for performing a semiconductor process, such as oxidation, diffusion, film formation, or annealing. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

In the process of manufacturing semiconductor devices, several types of heat-processing apparatuses are used for subjecting target substrates, such as semiconductor wafers, to a semiconductor process, such as oxidation, diffusion, film formation, or annealing. A single-substrate-processing apparatus, which handles wafers one by one, is known as one of these heat-processing apparatuses. The single-substrate-processing apparatus generally includes an airtight process chamber, and a worktable disposed in the process chamber for mounting a target substrate.

As a single-substrate-processing apparatus, there is an oxidizing apparatus using ozone ($O_3$) gas as a process gas. The oxidizing apparatus includes a ceramic worktable in which a resistance heating body is embedded. During a process, ozone gas is supplied as a process gas from above in the process chamber and is irradiated with ultraviolet (UV) rays emitted from UV lamps. With the UV ray irradiation, the ozone is decomposed into oxygen ($O_2$) and oxygen radicals ($o^+$), which are then supplied onto the surface of a wafer.

The worktable of the oxidizing apparatus has an electrically insulating surface. Accordingly, during a process, the wafer and the worktable are charged with static electricity due to ions and electrons generated by the UV ray irradiation. The static electricity causes the wafer to be attracted and held on the worktable by electrostatic force (Coulomb's force). Consequently, when the wafer is transferred from the worktable after the process, separating the wafer from the worktable requires a large force. If the wafer cannot be separated from the worktable smoothly, the wafer may be damaged.

In order to solve this problem, there is a structure known in which a conductive mount plate is disposed on a worktable, and is grounded through a lead line, so that static electricity is removed. This structure, however, entails problems in that, as additional elements are needed, the structure becomes complicated, maintenance operations become difficult, and the cost increases, due to the arrangement of the conductive mount plate and the lead line.

BRIEF SUMMARY OF THE INVENTION

An object of the present invention is to provide a single-substrate-processing apparatus for a semiconductor process, which removes static electricity generated on a worktable with a simple structure, thus simplifying maintenance operations and not increasing the cost.

According to a first aspect of the present invention, there is provided a single-substrate-processing apparatus for performing a semiconductor process, comprising:

an airtight process chamber;

a worktable configured to support a target substrate within the process chamber, and having an insulating surface;

a supply section configured to supply a process gas into the process chamber;

an exhaust section configured to vacuum-exhaust the process chamber; and a conduction structure configured to conduct static electricity generated on the worktable to a grounded portion outside the process chamber, the conduction structure having a first conductive film formed on the insulating surface of the worktable.

According to a second aspect of the present invention, there is provided a single-substrate-processing apparatus for performing oxidation of a semiconductor process, comprising:

an airtight process chamber;

a worktable configured to support a target substrate within the process chamber, and having an insulating surface;

a pedestal standing upright in the process chamber, supporting the worktable, and having an insulating surface;

a supply section configured to supply a process gas containing an oxidizing gas into the process chamber;

an exhaust section configured to vacuum-exhaust the process chamber;

a window formed in a casing of the process chamber and facing the worktable;

a UV lamp disposed outside the process chamber and facing the window, the UV lamp being configured to radiate UV rays onto the oxidizing gas above the worktable to activate the oxidizing gas; and a conduction structure configured to conduct static electricity generated on the worktable to a grounded portion outside the process chamber, the conduction structure having a first conductive film formed on the insulating surface of the worktable, and a second conductive film formed on the insulating surface of the pedestal and electrically connected to the first conductive film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
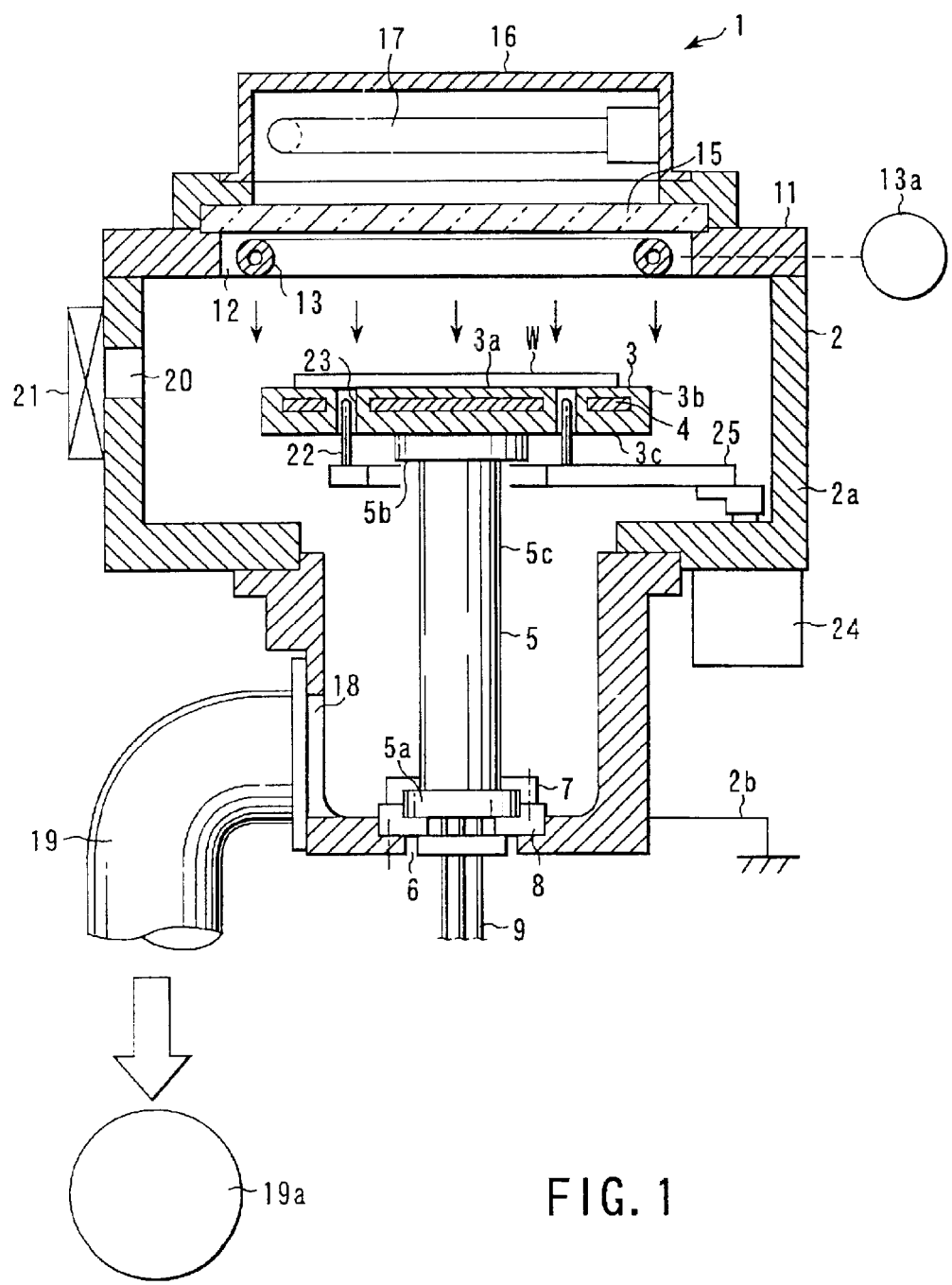
FIG. 1 is a schematic sectional view showing a single-substrate-processing apparatus according to an embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

FIG. 1 is a schematic sectional view showing a single-substrate-processing apparatus according to an embodiment of the present invention. This apparatus 1 is constituted as a single-substrate-processing apparatus for subjecting semiconductor wafers, i.e., target substrates, to oxidation one by one.

The single-substrate-processing apparatus 1 includes a process chamber 2 defined by a casing 2a made of a heat resistant material, such as a metal, preferably, aluminum. The inner surface of the casing 2a has been subjected to a surface treatment, such as an anodic oxidation treatment, to provide the surface with a corrosion resistance, and to prevent metal contamination to a wafer. The core of the casing 2a is conductive, and is grounded by a ground line 2b.

In the process chamber 2, there is a circular worktable (susceptor) 3 having a circular mount surface 3a, on which the wafer W is mounted. The worktable 3 consists essentially of a material, which is heat resistant, electrically insulating, and non-contaminating to the wafer W, such as one selected from the group consisting of a ceramic, e.g., sintered aluminum nitride (AlN); quartz; a metal coated with ceramic; and so forth. A resistance heater 4 for heating the wafer W through the worktable 3 is horizontally disposed and embedded in the worktable 3. As a result, the worktable 3 constitutes a so-called ceramic heater, which is clean without any metal contaminant relative to the wafer W. The resistance heater 4 is controlled by a controller (not shown), so that the wafer W on the worktable 3 is heated to a predetermined temperature.

The worktable 3 is integratedly arranged on the top of a pedestal 5, which is disposed on the bottom of the casing 2a of the processing chamber 2 to stand upright. For example, the pedestal 5 is made of the same material as the worktable 5, such as a ceramic, and is formed of a hollow circular column or cylinder. Electrical cables 9 for the resistance heater 4 and a thermo-sensor disposed in the worktable 3 are led out of the process chamber 2 through the hollow portion of the pedestal 5 and the bottom opening 6 of the process chamber 2.

The bottom of the pedestal 5 is provided with a flange 5a, which is sandwiched between upper and lower flange holders 7 and 8 made of a metal, such as aluminum. The lower flange holder 8 is fixed by screws to the casing 2a of the process chamber 2 to airtightly close the bottom opening 6 of the process chamber 2 from inside. The upper and lower flange holders 7 and 8 are fixed to each other by screws, so that the pedestal 5 is supported by the casing 2a.

Figure 2:
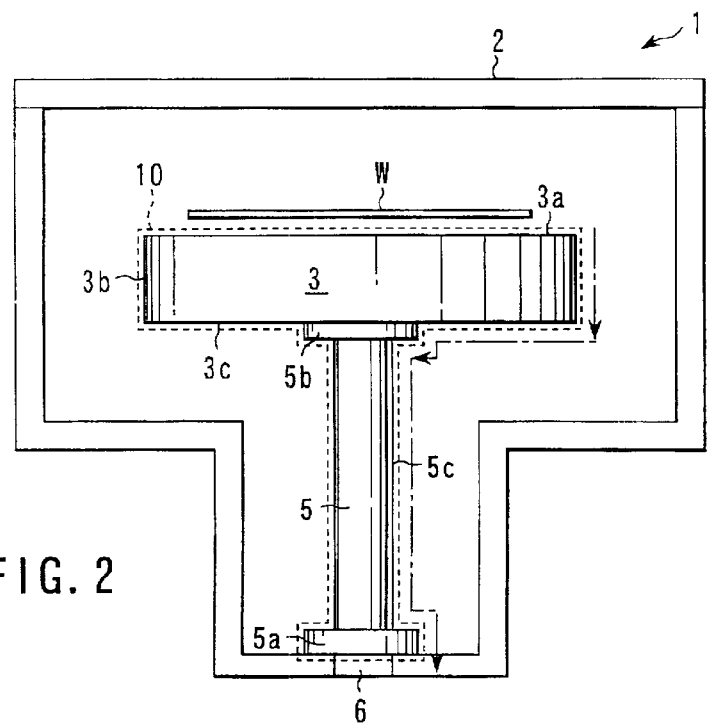
FIG. 2 is a view showing a conduction structure for static electricity adopted in the apparatus shown in FIG. 1, and the static electricity route of the conduction structure.

A conduction structure for static electricity is formed to conduct static electricity generated on the worktable 3 and the wafer W placed thereon to a ground portion outside the process chamber 2. FIG. 2 is a view showing the conduction structure for static electricity, and the static electricity route of the conduction structure. The conduction structure includes a conductive film 10 formed on the insulating surfaces of the worktable 3 and the pedestal 5. More specifically, the conductive film 10 is integrally formed on substantially the entire surface of the worktable 3, i.e., the mount surface 3a, side surface 3b, and bottom surface 3c except the connecting portion to the pedestal 5, and on substantially the entire surface of the pedestal 5, i.e., the side surface 5c and the surface of the upper and lower flanges 5b and 5a. The conductive film 10 consists essentially of a material selected from the group consisting of a conductive ceramic containing no metal elements, such as silicon carbide (SiC); titanium oxide ($TiO_2$); and so forth.

The thickness of the conductive film 10 is set at 20 to 100 μm, and preferably at 50 to 100 μm. Where the conductive film 10 is too thick, the film becomes fragile. On the other hand, where the conductive film 10 is too thin, the film has a low reliability in the continuity and easily peels when the mount surface 3a is subjected to a treatment for attaining flatness.

Where the conductive film 10 consists of silicon carbide, the film 10 may be formed by means of CVD (Chemical Vapor Deposition). Where the conductive film 10 consists of titanium oxide, the film 10 may be formed by means of thermal spraying. In either case, the portions of the conductive film 10 on the worktable 3 and the pedestal 5 may all be formed integrally.

That portion of the casing 2a of the process chamber 2, which is in contact with the pedestal 5 through the metal flange holders 7 and 8, has no anodized aluminum surface, i.e., has not been subjected to an anodic oxidation treatment, but has an exposed conductive surface. The exposed conductive surface may be obtained by masking the corresponding portion so as not to subject it to the anodic oxidation treatment, when the casing 2a is manufactured. The exposed conductive surface of the casing 2a comes in direct contact with the metal flange holders 7 and 8, so that a conductive passage for static electricity is ensured from the conductive film 10 through the core of the casing 2a to the ground line 2b.

The casing 2a of the process chamber 2 is constituted of upper and lower casing parts, which are detachably joined at a position close to the middle in the vertical direction. The upper casing part, in which the worktable 3 is disposed, has a diameter larger than that of the lower casing part, in which the pedestal 5 is disposed. The casing 2a of the process chamber 2 has a ceiling, which is formed of an openable or detachable lid 11. The lid 11 has an opening 12 having a size larger than that of the worktable 3 at a position opposite to the worktable 3. A ring showerhead 13 made of quartz is disposed near the opening 12, and is connected to a gas supply section 13a for supplying a process gas containing an oxidizing gas, such as ozone (O3). The showerhead 13 is provided with a number of gas spouting holes, which are formed at the bottom to spout a process gas, such as ozone, toward the wafer W on the worktable 3.

A transmission window 15, which is made of quartz and is transparent to ultraviolet (UV) rays, is airtightly attached to the upper portion of the lid 11 and covers the opening 12. A lamp chamber 16 is formed on the transmission window 16, and accommodates a plurality of UV lamps 17 facing the transmission window 15. UV rays emitted from the UV lamps 17 are transmitted through the window 15 and radiated onto the ozone gas supplied from the showerhead 13 in the space above the worktable 3. Consequently, the ozone is decomposed into oxygen ($O_2$) and oxygen radicals ($o^+$), which are then supplied onto the surface of the wafer W.

An exhaust port 18 is formed in the sidewall of the casing 2a of the process chamber 2 near the bottom. The exhaust port 18 is connected through an exhaust line 19 to an exhaust section 19a, which includes a pressure reducing pump and a pressure controller for vacuum-exhausting the process chamber 2 and setting it at certain pressures. A transfer port 20 is formed in the sidewall of the casing 2a of the process chamber 2 near the top, for transferring the wafer W into and out of the process chamber 2 by an outer transfer arm (not shown). The port 20 is provided with a gate valve 21, which is airtightly opened/closed.

A plurality of, e.g., three, lifer pins 22 are disposed in the worktable 3, for transferring the wafer W between the outer transfer arm and the worktable 3. The lifter pins 22 project and retreat relative to the mount surface 3a through respective through holes 23 formed in the worktable 3, so that they engage with the bottom surface of the wafer W. The lifter pins 22 are moved up and down by a driving section 24, such as an air cylinder, which is disposed outside the process chamber 2 and connected to the lifter pins 22 through a common elevating arm 25.

An explanation will be given of an operation of the single-substrate-processing apparatus having the above-described constitution.

First, the gate valve 21 of the port 20 is opened, and a wafer W is transferred into the process chamber 2 by the outer transfer arm. The lifter pins 22 are moved up to receive the wafer W from the outer transfer arm. Then, the lifter pins 22 are moved down to place the wafer W on the top of the worktable 2. After the outer transfer arm retreats out of the process chamber 2, the gate valve 21 is closed.

Then, the wafer W is heated to a predetermined process temperature by the resistance heater 4 disposed in the worktable 3. The process chamber 2 is supplied with ozone gas, i.e., a process gas, while the process chamber 2 is exhausted, so that the interior of the process chamber 2 is kept at a predetermined process pressure. The ozone gas is spouted from the holes of the showerhead 13 toward the wafer W on the worktable 3. At the same time, the UV lamps 17 in the lamp chamber 16 are turned on to emit UV rays. The UV rays are radiated onto the process gas containing ozone as the main component, above the worktable 3 in the process chamber 2. The ozone is decomposed into oxygen and oxygen radicals, due to irradiation with the UV rays. The wafer W on the worktable 3 is subjected to a predetermined process, i.e., oxidation, with the oxygen radicals.

During this process, static electricity is generated on the wafer W and the worktable 3 by ions and electrons generated by the UV ray irradiation. The surfaces of the worktable 3 and the pedestal 5 are covered with the conductive film 10, which is electrically connected to the casing 2a of the process chamber 2 and is grounded through the casing 2a. Consequently, the static electricity generated on the wafer W and the worktable 3 is sequentially conducted to the casing 2a of the process chamber, and is removed through the casing 2a.

Accordingly, when the wafer W is moved up from the top of the worktable 3 by the lifter pins 22 to transfer the wafer W out of the process chamber 2 after the process, no attraction force (Coulomb's force) is generated by the static electricity. In other words, the wafer W is not attracted or held on the top of the worktable 3, so the wafer W is smoothly separated from the worktable 3. The wafer W can be moved up from the top of the worktable 3 with a small force, thereby preventing the wafer W from being damaged.

As described above, according to the single-substrate-processing apparatus shown in FIG. 1, the conduction structure for static electricity is formed to conduct static electricity generated on the worktable 3 and the wafer W placed thereon to a ground portion outside the process chamber 2. The conduction structure includes the conductive film 10, which is integrally formed on substantially the entire surface of the worktable 3, i.e., the mount surface 3a, side surface 3b, and bottom surface 3c except the connecting portion to the pedestal 5, and on substantially the entire surface of the pedestal 5, i.e., the side surface 5c and the surface of the upper and lower flanges 5b and 5a.

Although the main body of the worktable 3 has an electrically insulating surface, static electricity generated on the worktable 3 is swiftly removed through the conductive film 10, which covers the insulating surface. As a result, it is possible to solve the problem related to a wafer W being attracted and held on a worktable 3 by static electricity, when the wafer is unloaded. Furthermore, the conduction structure of the apparatus shown in FIG. 1 requires no conductive mount plate or lead line, which bring about problems in that, as additional elements are needed, the structure becomes complicated, maintenance operations become difficult, and the cost increases.

Where the conductive film 10 consists of a conductive ceramic containing no metal elements, the wafer W is prevented from suffering any metal contamination. Especially, where CVD-SiC is used as the material of the conductive film 10, the conductive film 10 consisting of a highly pure SiC is integrally deposited on the surfaces of the worktable 3 and the pedestal 5. In this case, it is ensured that the conductive film 10 does not cause problems of pealing and metal contamination to the wafer W.

Figure 3:
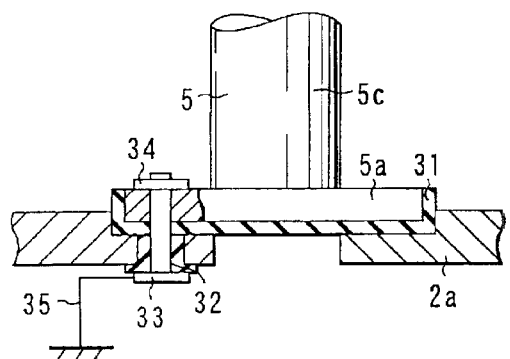
FIG. 3 is an enlarged sectional view showing the main portion of an apparatus according to another embodiment of the present invention.

FIG. 3 is an enlarged sectional view showing the main portion of an apparatus according to another embodiment of the present invention. The apparatus according to this embodiment has a structure basically the same as that of the apparatus shown in FIG. 1, but differs from it in a connecting structure for a pedestal 5 to the casing 2a of process chamber 2, and in that portion of a conduction structure for static electricity which relates to the connecting structure, as described below.

More specifically, in the apparatus shown in FIG. 3, an insulating plate 31 is sandwiched between the lower flange 5a of the pedestal 5 and the casing 2a of the process chamber 2. The flange 5a is attached and fixed to the casing 2a by conductive bolts 33 and conductive nuts 34. Insulating sleeves 32 are disposed in respective holes of the casing 2a, through which the bolts 33 penetrate. The bolts 33 are grounded by a ground line 35.

With this arrangement, in the apparatus shown in FIG. 3, the conductive film 10 formed on the worktable 3 and the pedestal 5 is electrically isolated from the casing 2a of the process chamber 2, and is grounded through the conductive nuts and bolts 34 and 33, and the ground line 35. Accordingly, static electricity generated on the wafer W and the worktable 3 during a process is conducted and removed, without passing through the casing 2a of the process chamber 2. As a result, the static electricity generated on the wafer W and the worktable 3 does not affect the conditions of the casing 2a of the process chamber 2.

Figure 4:
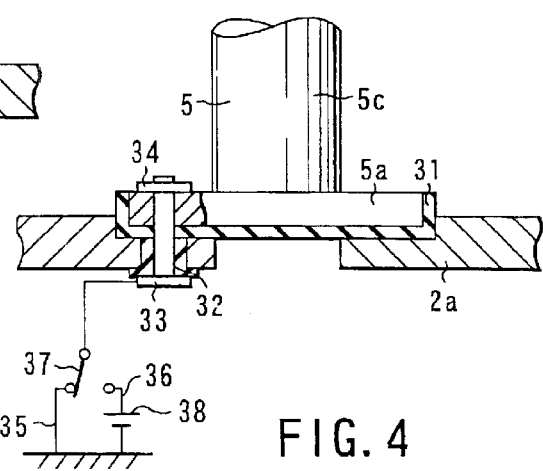
FIG. 4 is an enlarged sectional view showing the main portion of an apparatus according to still another embodiment of the present invention.

FIG. 4 is an enlarged sectional view showing the main portion of an apparatus according to still another embodiment of the present invention. The apparatus according to this embodiment has a structure basically the same as that of the apparatus shown in FIG. 3, but differs from it in that conductive bolts 33 are selectively connected to either one of a ground line 35 and a bias line 36 by a switch 37. The bias line 36 is connected to a DC (Direct Current) power supply 38 such that a positive electrical potential can be applied to the bolts 33.

In the apparatus shown in FIG. 4, the switch 37 is connected to the ground line 35 during a process to cause static electricity generated on the wafer W and the worktable 3 to be removed through the ground line 35. When the wafer W is unloaded, the switch 37 is changed to the bias line 36, so that a positive electrical potential is actively applied to the mount surface 3a of the worktable 3. With this operation, the electrical charge left on the wafer W and the worktable 3 is cancelled, so that the wafer W is smoothly separated from the worktable 3.

The present invention may be applied to a processing apparatus, other than an oxidizing apparatus, such as a diffusing, film-forming, etching, or annealing apparatus, and especially to an apparatus utilizing plasma for a process. Furthermore, the present invention may be applied to a target substrate other than a semiconductor wafer, such as an LCD substrate, or a glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A single-substrate-processing apparatus for performing a semiconductor process, comprising:
   an airtight process chamber configured to process a target substrate;
   a ceramic heater disposed within the process chamber, and having a worktable configured to support and heat the target substrate, and an insulating pedestal connected to the worktable to support the worktable; and
   a conductive film formed on surfaces and connecting of the ceramic heater and the insulating pedestal, and electrically connected at a lower end of the pedestal to a grounded portion, which is disposed as a part of the process chamber or disposed outside the process chamber.

2. The apparatus according to claim 1, wherein the conductive film comprises at least one of silicon carbide and titanium oxide.

3. The apparatus according to claim 1, wherein the conductive film is a film formed by means of chemical vapor deposition.

4. The apparatus according to claim 1, wherein the conductive film is a film formed by means of thermal spraying.

5. The apparatus according to claim 1, wherein the conductive film has a thickness ranging from 20 to 100 $\mu$m.

6. The apparatus according to claim 1, wherein, the worktable and the pedestal comprise insulating surfaces on which the conductive film is formed.

7. The apparatus according to claim 6, wherein portions of the worktable and the pedestal facing an atmosphere in the process chamber are covered with the conductive film.

8. The apparatus according to claim 1, wherein the conductive film is electrically connected to a conductive portion of a casing of the process chamber, which is grounded.

9. The apparatus according to claim 1, wherein the pedestal is attached to the process chamber by a fixing member which penetrates a casing of the process chamber, and a conductive portion of the fixing member is electrically connected to the conductive film.

10. The apparatus according to claim 9, further comprising:
    a bias section configured to selectively apply a positive electrical potential to the conductive portion of the fixing member.

11. The apparatus according to claim 10, wherein the bias section comprises:
    a switch configured to switch between a state where the conductive portion of the fixing member is grounded and a state where the conductive portion of the fixing member is connected to the bias section.

12. The apparatus according to claim 1, further comprising:
    a supply section configured to supply a process gas into the process chamber;
    an exhaust section configured to vacuum-exhaust the process chamber,
    a window formed in a casing of the process chamber and facing the worktable; and
    a UV lamp disposed outside the process chamber and facing the window, the UV lamp being configured to radiate UV rays onto the process gas above the worktable to activate the process gas.

13. The apparatus according to claim 12, wherein the process gas contains an oxidizing gas for subjecting the target substrate to oxidation.

14. The apparatus according to claim 13, wherein the oxidizing gas comprises ozone gas.

15. The apparatus according to claim 1, wherein the pedestal is attached to a casing of the process chamber by a flange and a fixing member, and stands within the process chamber.

16. The apparatus according to claim 15, wherein the conductive film is electrically connected to a conductive portion of the flange and a conductive portion of the fixing member, and is electrically connected to the grounded portion disposed outside the process chamber through the conductive portion of the fixing member.

17. The apparatus according to claim 16, wherein the conductive portions of the flange and the fixing member are electrically isolated from the casing.

18. The apparatus according to claim 17, further comprising a bias section configured to selectively apply a positive electrical potential to the conductive portion of the fixing member.

19. The apparatus according to claim 18, wherein the bias section comprises a switch configured to switch between a state where the conductive portion of the fixing member is grounded and a state where the conductive portion of the fixing member is connected to the bias section.

* * * * *